United States Patent
Qiu

(10) Patent No.: US 11,106,257 B2
(45) Date of Patent: Aug. 31, 2021

(54) OVER-TEMPERATURE PROTECTION CIRCUIT AND MOTHERBOARD PLATFORM USING SAME

(71) Applicant: HONGFUJIN PRECISION ELECTRONICS(TIANJIN)CO.,LTD., Tianjin (CN)

(72) Inventor: Duo Qiu, Shenzhen (CN)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 140 days.

(21) Appl. No.: 16/506,233

(22) Filed: Jul. 9, 2019

(65) Prior Publication Data

US 2020/0310504 A1    Oct. 1, 2020

(30) Foreign Application Priority Data

Mar. 25, 2019 (CN) .......................... 201910228932.4

(51) Int. Cl.
*G06F 1/20* (2006.01)
*H02H 1/00* (2006.01)
*H03K 19/173* (2006.01)

(52) U.S. Cl.
CPC ........... *G06F 1/206* (2013.01); *H02H 1/0007* (2013.01); *H02H 1/0092* (2013.01); *H03K 19/173* (2013.01)

(58) Field of Classification Search
CPC .......... G06F 1/20; G06F 1/206; G06F 1/3206; G06F 1/324; G06F 1/3296; H02H 1/0007; H02H 1/0092; Y02D 10/00
See application file for complete search history.

(56) References Cited

U.S. PATENT DOCUMENTS

2002/0104030 A1*   8/2002   Ahn ........................ G06F 1/206
                                                                        713/310
2017/0285700 A1*  10/2017   Cartagena ............. G06F 1/3206

* cited by examiner

*Primary Examiner* — Terrell S Johnson
(74) *Attorney, Agent, or Firm* — ScienBiziP, P.C.

(57) ABSTRACT

An over-temperature protection circuit applied in a motherboard platform includes a first processor, a second processor, and a peripheral circuit. The first processor includes first temperature detection unit, the second processor includes second temperature detection unit. The over-temperature protection circuit includes third temperature detection unit and digital processing unit. The first processor can determine that the motherboard platform is in an over-temperature state through the first temperature detection unit, the second processor can determine that the motherboard platform is in the over-temperature state through the second temperature detection unit, and the digital processing unit can determine that the motherboard platform is in the over-temperature state through the third temperature detection unit. When an over-temperature state is determined by any such means, the first processor controls the motherboard platform to enter a sleep mode.

16 Claims, 3 Drawing Sheets

OVER-TEMPERATURE PROTECTION CIRCUIT AND MOTHERBOARD PLATFORM USING SAME

FIELD

The subject matter herein generally relates to safety in electronic devices.

BACKGROUND

The multi-processor architecture is widely used in servers. Multi-processor platform may include a first processor and a second processor, the first processor is defined as a boot strap processor (BSP) with an integrated fusion controller hub (FCH), and the second processor is defined as an application processor (AP). The integrated FCH only supports a thermal protection process in response to over-temperature states of the first processor and the second processor. The integrated FCH does not respond to external temperature sensors and thus does not start a the thermal protection process when it is required.

BRIEF DESCRIPTION OF THE DRAWINGS

Implementations of the present technology will now be described, by way of embodiment only, with reference to the attached figures.

DETAILED DESCRIPTION

Figure 1:
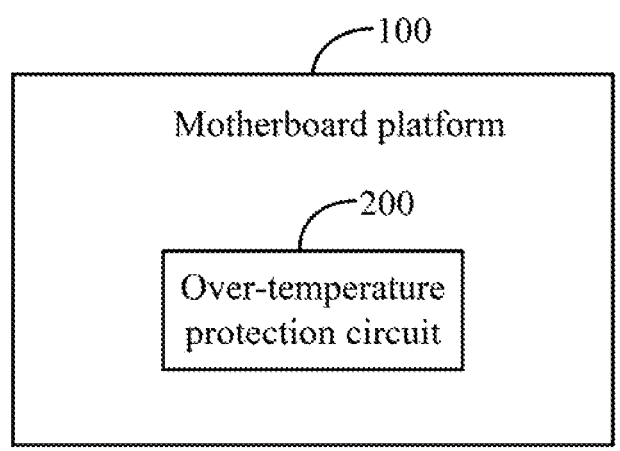
FIG. 1 is a block diagram of one embodiment of an over-temperature protection circuit of a motherboard platform in its operating environment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure. It should be noted that references to "an" or "one" embodiment in this disclosure are not necessarily to the same embodiment, and such references mean "at least one".

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

FIG. 1 illustrates a motherboard platform in accordance with an embodiment (motherboard platform 100). The motherboard platform 100 comprises an over-temperature protection circuit 200 providing over-temperature protection to the motherboard platform 100.

In one embodiment, the motherboard platform 100 can be applied in a computer, a server, a switch, etc. For example, the motherboard platform 100 can be an AMD SP3 platform.

Figure 2:
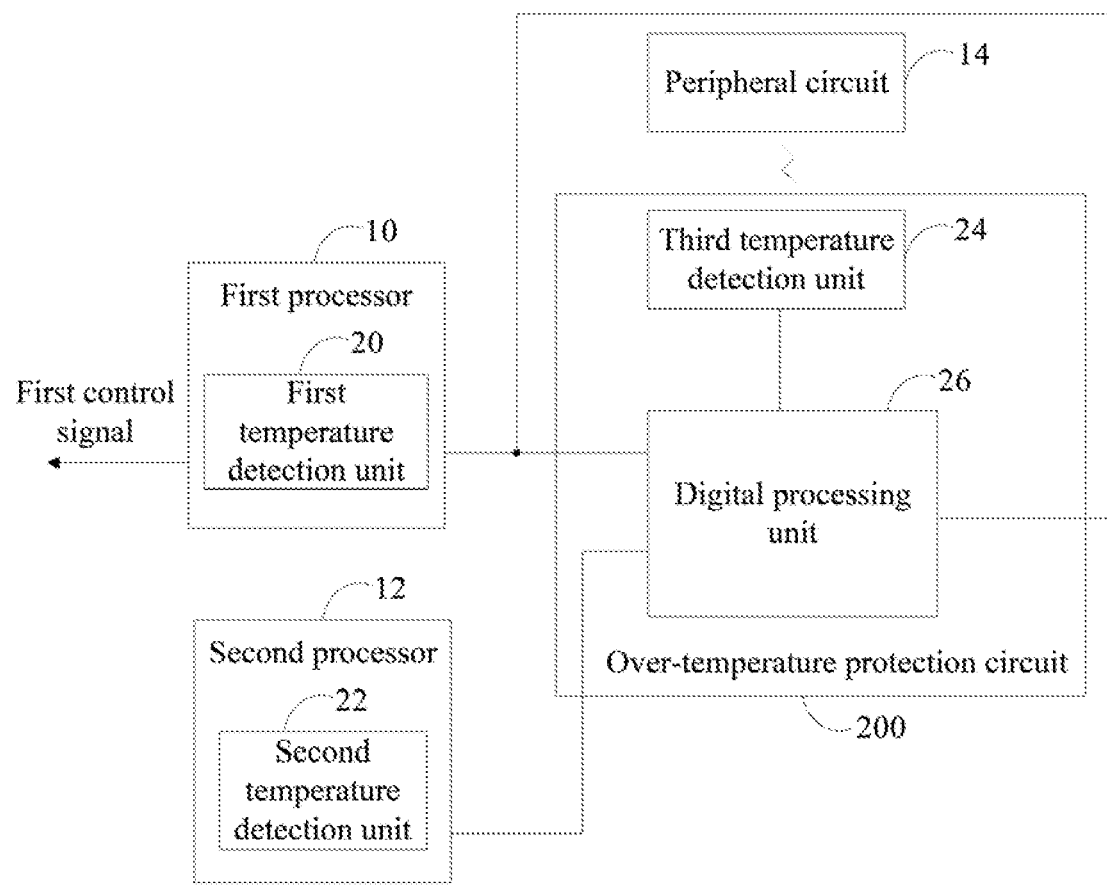
FIG. 2 is a block diagram of a motherboard platform of FIG. 1 in one embodiment.

Referring to FIG. 2, the motherboard platform 100 further comprises a first processor 10, a second processor 12, and a peripheral circuit 14. The peripheral circuit 14 can comprise a plurality of electronic elements that operate with the first processor 10 and the second processor 12. The first processor 10 can be a boot strap processor (BSP) of the motherboard platform 100 to guide an initialization process of the motherboard platform 100. The second processor 12 can be an application processor (AP) of the motherboard platform 100.

In one embodiment, the first processor 10 comprises a first temperature detection unit 20. The first temperature detection unit 20 is configured to detect a temperature of the first processor 10 and output a first temperature detection signal. The second processor 12 comprises a second temperature detection unit 22, the second temperature detection unit 22 is configured to detect a temperature of the second processor 12 and output a second temperature detection signal.

The over-temperature protection circuit 200 can comprise a third temperature detection unit 24 and a digital processing unit 26. The digital processing unit 26 is coupled to the first processor 10, the second processor 12, and the third temperature detection unit 24. The third temperature detection unit 24 is configured to detect a temperature of the peripheral circuit 14 and output a third temperature detection signal.

In one embodiment, the third temperature detection unit 24 can be set into the peripheral circuit 14, or can be located close to a major heat-generating element of the peripheral circuit 14.

In one embodiment, the first temperature detection unit 20 can be integrated into the first processor 10, and the second temperature detection unit 22 can be integrated into the second processor 12. The first temperature detection unit 20 can also be independent of the first processor 10, and the first temperature detection unit 20 can be close to the first processor 10 to detect the temperature of the first processor 10. The second temperature detection unit 22 can also be independent of the second processor 12, and the second temperature detection unit 22 can be close to the second processor 12 to detect the temperature of the second processor 12.

In one embodiment, when the first processor 10 determines that the temperature of the motherboard platform 100 is too high (over-temperature state) based on the first temperature detection signal, the first processor 10 outputs a first control signal to control the motherboard platform 100 to enter a sleep mode. When the second processor 12 determines that the temperature of the motherboard platform 100 is too high based on the second temperature detection signal, the second processor 12 outputs a over-temperature signal to the digital processing unit 26. The digital processing unit 26 outputs a second control signal to the first processor 10 according to the over-temperature signal, and the first processor 10 outputs the first control signal to control the motherboard platform 100 to enter the sleep mode according to the second control signal. When the digital processing unit 26 determines that the temperature of the motherboard platform 100 is too high based on the third temperature detection signal, the digital processing unit 26 outputs a third control signal to the first processor 10, the first processor 10 outputs the first control signal to control the motherboard platform 100 to enter the sleep mode according to the third control signal.

In one embodiment, when the motherboard platform 100 is in the over-temperature state, it may mean that the first processor 10 in the over-temperature state, or the second processor 12 in the over-temperature state, or the peripheral circuit 14 may be in the over-temperature state.

In one embodiment, the sleep mode can be an S5 state (a state of advanced configuration and power interface). When the motherboard platform 100 is determined to be in the over-temperature state, the first processor 10 outputs the first control signal to control the motherboard platform 100 to enter the S5 state. In other embodiments, the sleep mode can also be an S3 or an S4 state.

In one embodiment, the digital processing unit 26 can be a programmable logic device (PLD), a complex programmable logic device (CPLD), or a field programmable gate array (FPGA). The digital logic processing unit 26 can be a digital logic chip on the motherboard platform 100 itself, thereby saving cost. The third temperature detection unit 24 can be a temperature sensor or a thermistor.

Figure 3:
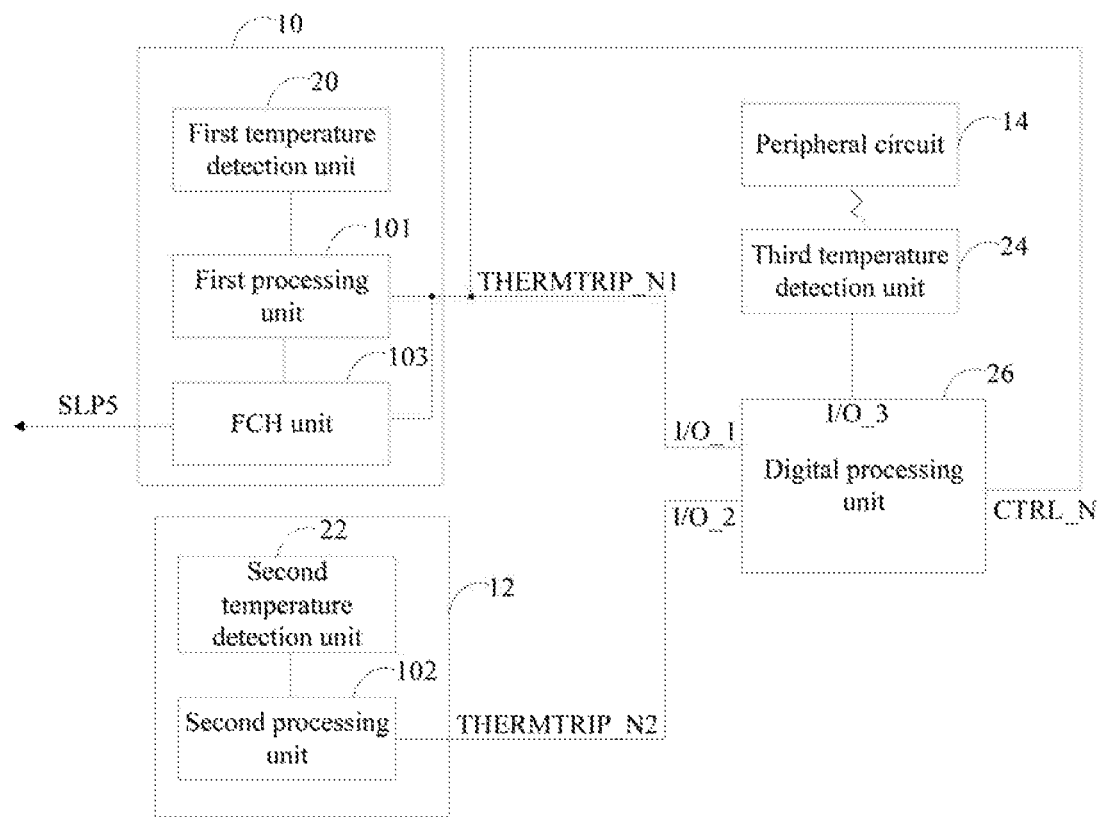
FIG. 3 is a circuit diagram of the motherboard platform of FIG. 1.

Referring to FIG. 3, the first processor 10 can comprise the first temperature detection unit 20, a first processing unit 101, and a fusion controller hub (FCH) unit 103. The first processing unit 101 comprises a first thermal-trip pin THERMTRIP_N1. When the first processing unit 101 determines that the first processor 10 is in the over-temperature state based on the first temperature detection signal, the first thermal-trip pin THERMTRIP_N1 outputs a first thermal triggering signal to the FCH unit 103, and a standby control pin SLP5 of the FCH unit 103 outputs the first control signal to control the motherboard platform 100 to enter the sleep mode.

The second processor 12 can comprise the second temperature detection unit 22 and a second processing unit 102. The second processing unit 102 comprises a second thermal-trip pin THERMTRIP_N2. When the second processing unit 102 determines that the second processor 12 is in the over-temperature state based on the second temperature detection signal, the second thermal-trip pin THERMTRIP_N2 outputs a second thermal triggering signal to the digital processing unit 26, the digital processing unit 26 outputs the second control signal to enable the first thermal-trip pin THERMTRIP_N1 according to the second thermal triggering signal, and the standby control pin SLP5 of the FCH unit 103 outputs the first control signal to control the motherboard platform 100 to enter the sleep mode.

In one embodiment, the digital processing unit 26 can comprise a first signal pin I/O_1, a second signal pin I/O_2, a third signal pin I/O_3, and a control pin CTRL_N. The first signal pin I/O_1 is coupled to the first thermal-trip pin THERMTRIP_N1, and the first signal pin I/O_1 can receive the first thermal triggering signal outputted by the first thermal-trip pin THERMTRIP_N1. The second signal pin I/O_2 is coupled to the second thermal-trip pin THERMTRIP_N2, and the second signal pin I/O_2 can receive the second thermal triggering signal outputted by the second thermal-trip pin THERMTRIP_N2. The third signal pin I/O_3 is coupled to the third temperature detection unit 24, and the third signal pin I/O_3 can receive the third temperature detection signal.

When the digital processing unit 26 determines that the peripheral circuit 14 is in the over-temperature state based on the third temperature detection signal, the control pin CTRL_N of the digital processing unit 26 outputs the third control signal to enable the first thermal-trip pin THERMTRIP_N1, and the standby control pin SLP5 of the FCH unit 103 outputs the first control signal to control the motherboard platform 100 to enter the sleep mode.

In one embodiment, each of the first signal pin I/O_1, the second signal pin I/O_2, and the third signal pin I/O_3 can respectively receive over-temperature signals of the first processor 10, the second processor 12, and the peripheral circuit 14. Then, the digital processing unit 26 can generate over-temperature triggering logs with respect to the first processor 10, the second processor 12, and the peripheral circuit 14 according to triggering states of the first signal pin I/O_1, the second signal pin I/O_2, and the third signal pin I/O_3. The motherboard platform 100 can record the over-temperature triggering logs.

In one embodiment, the first processor 10 can determine whether its own temperature is too high according to the first temperature detection signal and a first predetermined temperature. The second processor 12 can make the same determination about itself according to the second temperature detection signal and a second predetermined temperature. The digital processing unit 26 can make the same determination concerning itself according to the third temperature detection signal and a third predetermined temperature.

In one embodiment, the first predetermined temperature, the second predetermined temperature, and the third predetermined temperature can be the same or different temperature values. For example, temperature values of the first predetermined temperature and the second predetermined temperature can be 85 degrees, and a temperature value of the third predetermined temperature can be 80 degrees.

The embodiments shown and described above are only examples. Many details known in the field are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. An over-temperature protection circuit applicable to a motherboard platform, the motherboard platform comprising a first processor, a second processor, and a peripheral circuit, the first processor comprising a first temperature detector, the second processor comprising a second temperature detector, the first temperature detector detecting a temperature of the first processor and output a first temperature detection signal, the second temperature detector detecting a temperature of the second processor and output a second temperature detection signal, the over-temperature protection circuit comprising:
   a third temperature detector detecting a temperature of the peripheral circuit and output a third temperature detection signal; and
   a digital processor coupled to the first processor, the second processor, and the third temperature detector;

wherein when the first processor determines that the motherboard platform is in an over-temperature state based on the first temperature detection signal, the first processor outputs a first control signal to control the motherboard platform to enter a sleep mode;

when the second processor determines that the motherboard platform is in the over-temperature state based on the second temperature detection signal, the second processor outputs an over-temperature signal to the digital processor, the digital processor outputs a second control signal to the first processor according to the over-temperature signal, the first processor outputs the first control signal to control the motherboard platform to enter the sleep mode according to the second control signal; and when the digital processor determines that the motherboard platform is in the over-temperature state based on the third temperature detection signal, the digital processor outputs a third control signal to the first processor, the first processor outputs the first control signal to control the motherboard platform to enter the sleep mode according to the third control signal.

2. The over-temperature protection circuit of claim 1, wherein the digital processor is a complex programmable logic device (CPLD) or a field programmable gate array (FPGA).

3. The over-temperature protection circuit of claim 1, when the sleep mode is an S5 state.

4. The over-temperature protection circuit of claim 1, wherein the first processor further comprises a first processing unit and a fusion controller hub (FCH) unit, the first processing unit comprises a thermal-trip pin; when the first processing unit determines that the motherboard platform is in the over-temperature state based on the first temperature detection signal, the thermal-trip pin outputs a thermal triggering signal to the FCH unit, and the FCH unit outputs the first control signal to control the motherboard platform to enter the sleep mode according to the thermal triggering signal.

5. The over-temperature protection circuit of claim 4, wherein when the second processor determines that the motherboard platform is in the over-temperature state based on the second temperature detection signal, the digital processor outputs the second control signal to enable the thermal-trip pin according to the over-temperature signal, and the FCH unit outputs the first control signal to control the motherboard platform to enter the sleep mode.

6. The over-temperature protection circuit of claim 4, wherein when the digital processor determines that the motherboard platform is in the over-temperature state based on the third temperature detection signal, the digital processor outputs the third control signal to enable the thermal-trip pin, and the FCH unit outputs the first control signal to control the motherboard platform to enter the sleep mode.

7. The over-temperature protection circuit of claim 1, wherein the digital processor comprises a first signal pin, a second signal pin, and a third signal pin; the first signal pin is coupled to the first processor, the second signal pin is coupled to the second processor, and the third signal pin is coupled to the third temperature detector; and the digital processor generates over-temperature triggering logs with respect to the first processor, the second processor, and the peripheral circuit according to triggering states of the first signal pin, the second signal pin, and the third signal pin.

8. The over-temperature protection circuit of claim 1, wherein the first processor determines whether the motherboard platform is in the over-temperature state according to the first temperature detection signal and a first predetermined temperature, the second processor determines whether the motherboard platform is in the over-temperature state according to the second temperature detection signal and a second predetermined temperature, and the digital processor determines whether the motherboard platform is in the over-temperature state according to the third temperature detection signal and a third predetermined temperature.

9. A motherboard platform comprising:
a first processor comprising a first temperature detector, the first temperature detector detecting a temperature of the first processor and output a first temperature detection signal;
a second processor comprising a second temperature detector, the second temperature detector a temperature of the second processor and output a second temperature detection signal;
a peripheral circuit; and
an over-temperature protection circuit comprising:
a third temperature detector detecting a temperature of the peripheral circuit and output a third temperature detection signal; and
a digital processor coupled to the first processor, the second processor, and the third temperature detector;
wherein when the first processor determines that the motherboard platform is in an over-temperature state based on the first temperature detection signal, the first processor outputs a first control signal to control the motherboard platform to enter a sleep mode;
when the second processor determines that the motherboard platform is in the over-temperature state based on the second temperature detection signal, the second processor outputs an over-temperature signal to the digital processor, the digital processor outputs a second control signal to the first processor according to the over-temperature signal, the first processor outputs the first control signal to control the motherboard platform to enter the sleep mode according to the second control signal; and
when the digital processor determines that the motherboard platform is in the over-temperature state based on the third temperature detection signal, the digital processor outputs a third control signal to the first processor, the first processor outputs the first control signal to control the motherboard platform to enter the sleep mode according to the third control signal.

10. The motherboard platform of claim 9, wherein the digital processor is a complex programmable logic device (CPLD) or a field programmable gate array (FPGA).

11. The motherboard platform of claim 9, when the sleep mode is an S5 state.

12. The motherboard platform of claim 9, wherein the first processor further comprises a first processing unit and a FCH unit, the first processing unit comprises a thermal-trip pin; when the first processing unit determines that the motherboard platform is in the over-temperature state based on the first temperature detection signal, the thermal-trip pin outputs a thermal triggering signal to the FCH unit, and the FCH unit outputs the first control signal to control the motherboard platform to enter the sleep mode according to the thermal triggering signal.

13. The motherboard platform of claim 12, wherein when the second processor determines that the motherboard platform is in the over-temperature state based on the second temperature detection signal, the digital processor outputs the second control signal to enable the thermal-trip pin according to the over-temperature signal, and the FCH unit outputs the first control signal to control the motherboard platform to enter the sleep mode.

14. The motherboard platform of claim 12, wherein when the digital processor determines that the motherboard platform is in the over-temperature state based on the third temperature detection signal, the digital processor outputs the third control signal to enable the thermal-trip pin, and the FCH unit outputs the first control signal to control the motherboard platform to enter the sleep mode.

15. The motherboard platform of claim 9, wherein the digital processor comprises a first signal pin, a second signal pin, and a third signal pin; the first signal pin is coupled to the first processor, the second signal pin is coupled to the second processor, and the third signal pin is coupled to the third temperature detector; and the digital processor generates over-temperature triggering logs with respect to the first processor, the second processor, and the peripheral circuit according to triggering states of the first signal pin, the second signal pin, and the third signal pin.

16. The motherboard platform of claim 9, wherein the first processor determines whether the motherboard platform is in the over-temperature state according to the first temperature detection signal and a first predetermined temperature, the second processor determines whether the motherboard platform is in the over-temperature state according to the second temperature detection signal and a second predetermined temperature, and the digital processor determines whether the motherboard platform is in the over-temperature state according to the third temperature detection signal and a third predetermined temperature.

* * * * *